US007710797B2

(12) United States Patent
Lee

(10) Patent No.: US 7,710,797 B2
(45) Date of Patent: May 4, 2010

(54) SEMICONDUCTOR MEMORY DEVICE AND METHOD FOR DRIVING THE SAME

(75) Inventor: Chang-Hyuk Lee, Kyoungki-do (KR)

(73) Assignee: Hynix Semiconductors, Inc., Gyeonggi-do (KR)

( * ) Notice: Subject to any disclaimer, the term of this patent is extended or adjusted under 35 U.S.C. 154(b) by 166 days.

(21) Appl. No.: 11/819,791

(22) Filed: Jun. 29, 2007

(65) Prior Publication Data

US 2008/0074935 A1  Mar. 27, 2008

(30) Foreign Application Priority Data

Sep. 27, 2006  (KR) .................. 10-2006-0094053

(51) Int. Cl.
*G11C 7/00* (2006.01)
(52) U.S. Cl. .................. 365/191; 365/63; 365/230.08; 365/233.1; 365/189.11
(58) Field of Classification Search ............ 365/185.13, 365/182.05, 189.04, 233.12, 233.11, 191, 365/193, 233.1, 63, 230.08, 185.05
See application file for complete search history.

(56) References Cited

U.S. PATENT DOCUMENTS

| | | | |
|---|---|---|---|
| 6,970,369 B2* | 11/2005 | Funaba et al. ............ | 365/63 |
| 2001/0019503 A1* | 9/2001 | Ooishi ...................... | 365/191 |
| 2002/0097611 A1* | 7/2002 | Hayasaka et al. .......... | 365/191 |
| 2003/0117883 A1* | 6/2003 | Kim ........................... | 365/233 |
| 2003/0128592 A1 | 7/2003 | Ruckerbauer | |

FOREIGN PATENT DOCUMENTS

| | | |
|---|---|---|
| JP | 2004-021916 | 1/2004 |
| KR | 10-2003-0032831 A | 4/2003 |
| KR | 10-2005-0101865 | 10/2005 |

OTHER PUBLICATIONS

Korean Office Action issued in Korean Patent Application No. KR 10-2006-0094053, issued on Jan. 9, 2008.
Korean Office Action, with English translation, issued in Korean Patent Application No. KR 10-2006-0094053, mailed Aug. 31, 2007.

* cited by examiner

Primary Examiner—Pho M Luu
Assistant Examiner—Tha-O Bui
(74) Attorney, Agent, or Firm—IP & T Law Firm PLC

(57) ABSTRACT

A semiconductor memory device stably performs a write operation with reduced current consumption. The semiconductor memory device includes a global data, a control unit, a termination resistor unit, and a storage unit. The global data line transmits data. The control unit generates a global control signal during a read operation or a write operation. The termination resistance unit supplies termination resistance to the global data line in response to the global control signal. The storage unit stores the data transmitted to the global data line while the termination resistance unit is inactivated. A method for driving the semiconductor memory device includes detecting a read operation or a write operation and supplying termination resistance when the read or write operation is detected.

8 Claims, 3 Drawing Sheets

SEMICONDUCTOR MEMORY DEVICE AND METHOD FOR DRIVING THE SAME

CROSS-REFERENCE TO RELATED APPLICATIONS

The present invention claims priority of Korean patent application no. 10-2006-0094053, filed in the Korean Patent Office on Sep. 27, 2006, which is incorporated by reference in its entirety.

BACKGROUND OF THE INVENTION

The present invention relates to a semiconductor memory device; more particularly, to a semiconductor memory device for stably performing a write operation with reduced current consumption.

In a conventional semiconductor memory device, a global input/output (GIO) line is used at both of the write and read operations. A data input/output path in the write and read operations is briefly described below.

FIG. 1 is a schematic circuit diagram illustrating a data input/output path in a conventional semiconductor memory device. The semiconductor memory device includes a GIO line GIO, a termination resistor unit 10 and a storage unit 20.

The termination resistor unit 10 controls pull-up and pull-down resistance of the GIO line GIO when a read period signal RDS is activated. The storage unit 20 stores data loaded on the GIO line GIO when the read period signal RDS is inactivated.

FIG. 2 is a signal timing diagram illustrating an operation of the conventional semiconductor memory device in FIG. 1.

A read period signal RDS is activated in response to an internal read signal. The termination resistor unit 10 makes pull-up and pull-down resistance of the GIO line GIO to be identical in response to the read period signal RDS. Accordingly, a voltage on the GIO line GIO maintains a half of a supply voltage level ½ VDD. Data output from a memory cell unit is transmitted to the GIO line GIO, in order to be outputted to an external device.

After delay time corresponding to a burst length passes from activation timing of the internal read signal, at point a, the read period signal RDS is inactivated. The termination resistor unit 10 turns off and the active storage unit 20 stores the data transmitted to the GIO line GIO.

If a write operation is performed after the above read operation, an external data is inputted into the GIO line GIO in response to an internal write signal. FIG. 2 illustrates a voltage level change on the GIO line GIO in case that the write operation for a data having a high logic level is performed after the read operation for a data having a low logic level. The voltage level transitions from a ground voltage level VSS corresponding to the low logic level to a supply voltage level VDD corresponding to the high logic level.

In this way, a conventional semiconductor memory device turns off a termination resistor unit of a GIO line during the write operation. When the level of data input during the write operation is different from the level of data on the GIO line GIO, data transition from the ground voltage level VSS to the supply voltage level VDD is required. Accordingly, time for data to be inputted into the GIO line GIO increases and set-up/holding time margin needful for the next process becomes in short supply. During the next process, malfunctions can be caused by abnormal data.

SUMMARY OF THE INVENTION

Embodiments of the present invention are directed to providing a semiconductor memory device for stably performing a write operation with reduced current consumption.

In accordance with an aspect of the present invention, a semiconductor memory device includes a global data line for transmitting data, a control unit for generating a global control signal during a read operation or a write operation, a termination resistance unit for supplying termination resistance to the global data line in response to the global control signal, and a storage unit for storing the data transmitted to the global data line while the termination resistance unit is inactivated.

In accordance with another aspect of the present invention, a method for driving a semiconductor memory device includes detecting a read operation or a write operation and supplying termination resistance when the read or write operation is detected.

DESCRIPTION OF SPECIFIC EMBODIMENTS

A global data line of a semiconductor memory device in accordance with the present invention is supplied with termination resistance during a read operation and a write operation. A voltage on the global data line maintains a half of a supply voltage level. Without reference to a logic level of a data, a range of voltage transition on the global data line to input the data decreases. Accordingly, time for the voltage transition decreases and the stable write operation is performed. Reliability of input data improves Hereinafter, a semiconductor memory device in accordance with the present invention will be described in detail referring to the accompanying drawings.

Figure 1:
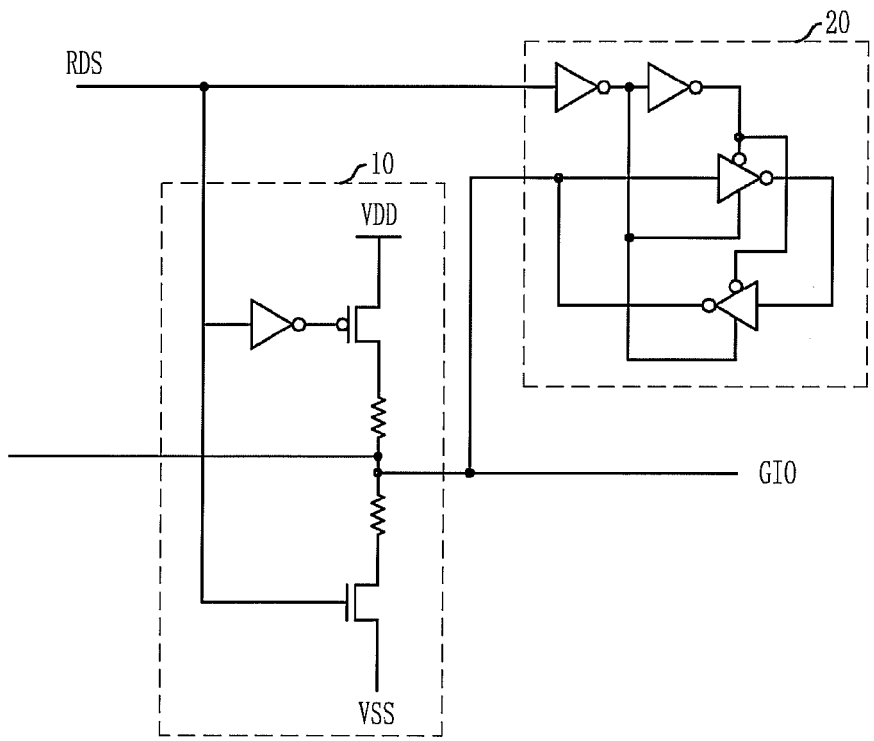
FIG. 1 is a schematic circuit diagram illustrating a data input/output path in a conventional semiconductor memory device.
Figure 2:
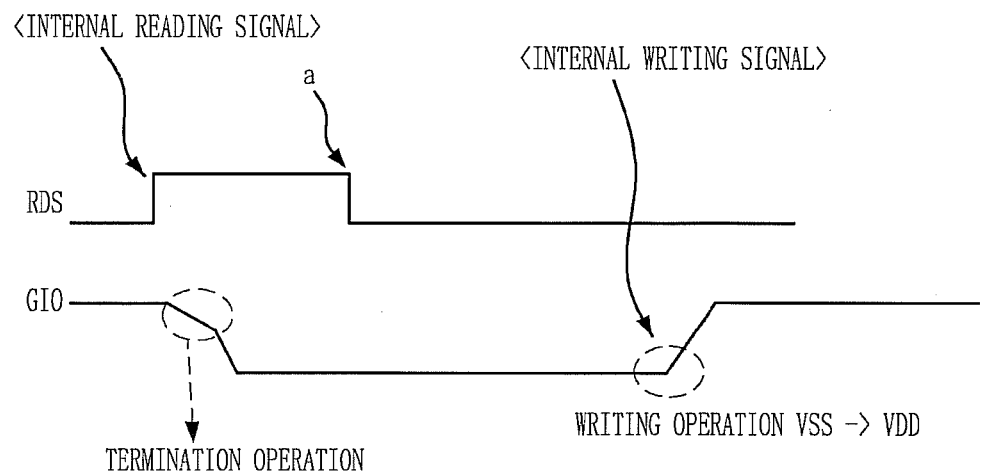
FIG. 2 is a signal timing diagram illustrating an operation of the conventional semiconductor memory device in FIG. 1.
Figure 3:
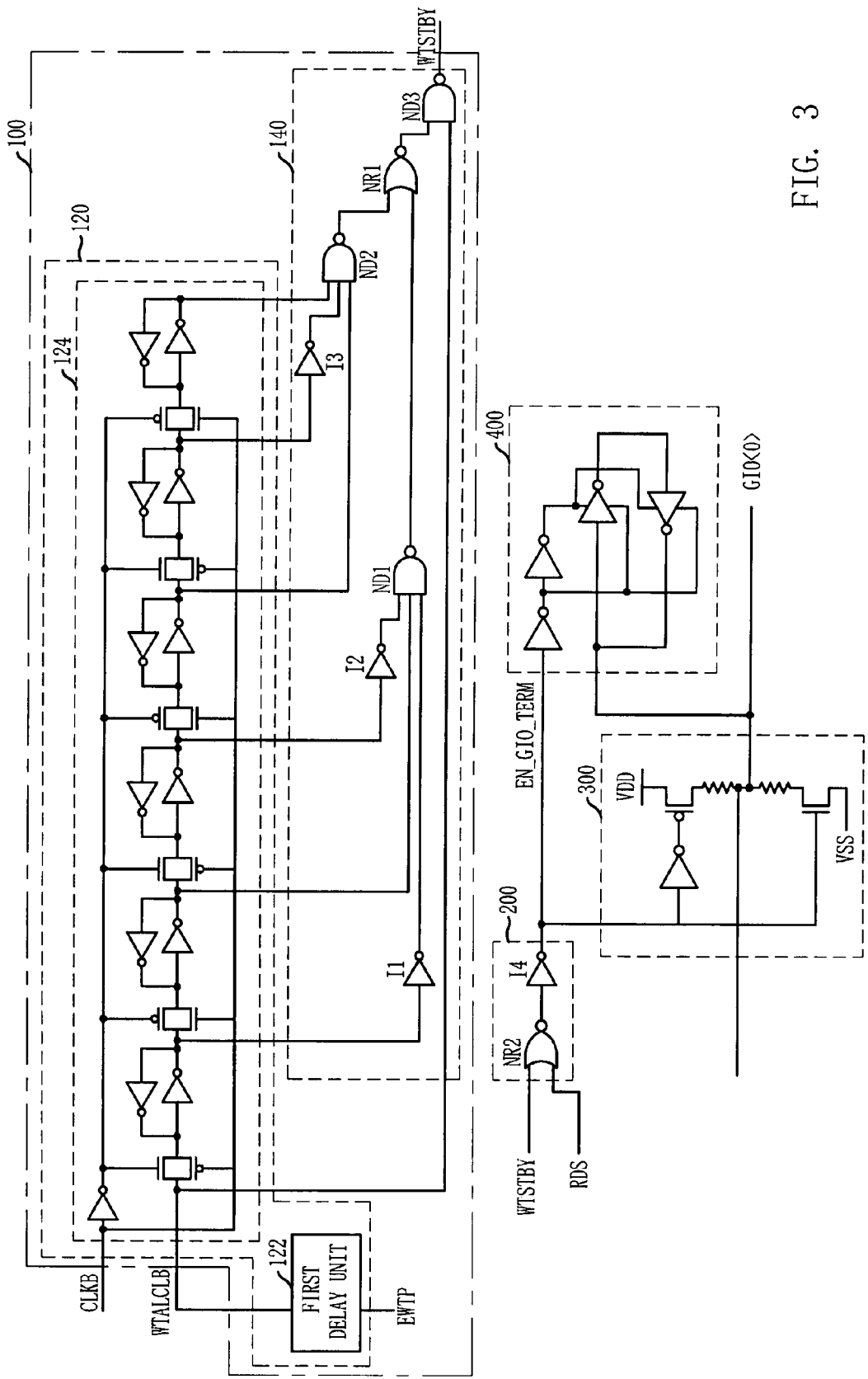
FIG. 3 is a block diagram illustrating a semiconductor memory device in accordance with the present invention.

FIG. 3 is a block diagram illustrating a semiconductor memory device in accordance with the present invention. The semiconductor memory device includes a global data line GIO, a control unit, a termination resistor unit 300, and a storage unit 400.

A data is transmitted through the global data line GIO during write and read operations. The control unit generates global-control signal EN_GIO_TERM at the write and read operations. The termination resistor unit 300 supplies termination resistance to the global data line GIO in response to the global-control signal EN_GIO_TERM. The storage unit 400 stores data transmitted to the global data line GIO in response to the global-control signal EN_GIO_TERM.

The semiconductor memory device includes the control unit for sensing the write and read operation periods and supplies termination resistance even during the write operation. Accordingly a voltage on the global data line GIO maintains a half of supply voltage level ½ VDD during the write operation. When a data is inputted into the global data line GIO, data transition occurs only within a range of the half of the supply voltage level ½ VDD. As data transition time decreases during the write operation, it is prevented sensing inaccurate data caused by a long transition time.

The operation of the semiconductor memory device is described below in detail.

The control unit includes a write alarm unit 100 and a control signal generator 200. The write alarm unit 100 generates a write alarm signal WTSTBY in response to an external write signal EWTP. The control signal generator 200 generates a global control signal EN_GIO_TERM in response to a read period signal RDS and the write alarm signal WTSTBY.

The write alarm unit 100 includes a shifting unit 120 and a write alarm signal generator 140. The shifting unit 120 outputs a plurality of delay signals over a predetermined time after the external write signal EWTP is inputted. The predetermined time corresponds to a write latency WL. The write latency WL is one internal clock less than an additive latency AL added to a cas latency CL. The alarm signal generator 140 receives the plurality of delay signals and outputs the write alarm signal WTSTBY.

The shifting unit 120 includes a first delay unit 122 and a second delay unit 124. The first delay unit 122 outputs a write latency signal WTALCLB earlier than an input timing of an internal write signal. That is, the first delay unit 122 outputs the write latency signal WTALCLB by delaying the external write signal EWTP for a predetermined time corresponding to the write latency WL. The predetermine time is set to be two internal clock less than the write latency WL in the first delay unit described in FIG. 3. The second delay unit 124 outputs six delay signals by delaying the write latency signal WTALCLB for each half internal clock. Each delay signal is activated prior to the subsequent one by a half internal clock.

The alarm signal generator 140 includes three inverters, three NAND gates and a NOR gate. A first inverter I1 inverts a first delay signal. A second inverter I2 inverts a third delay signal. A first NAND gate ND1 receives a second delay signal and outputs of the first and second inverters I1 and I2. A third inverter I3 inverts a fifth delay signal. A second NAND gate ND2 receives fourth and sixth delay signals and an output of the third inverter I3. A first NOR gate NR1 receives outputs of the first and second NAND gates ND1 and ND2. A third NAND gate receives the write latency signal WTALCLB and an output of the first NOR gate NR1, and outputs the write alarm signal WTSTBY.

The control signal generator 200 includes a second NOR gate NR2 and a fourth inverter I4. The second NOR gate receives the write alarm signal WTSTBY and the read period signal RDS. The fourth inverter I4 inverts an output of the second NOR gate NR2 and outputs the global control signal EN_GIO_TERM.

The termination resistor unit 300 includes an inverter, resistors and MOS transistors. The inverter inverts the global control signal EN_GIO_TERM. A PMOS transistor receives an output of the inverter through its gate and supplied with a supply voltage VDD through its source. A first resistor is connected between the global data line GIO and a drain of the PMOS transistor. A NMOS transistor receives the global control signal EN_GIO_TERM through its gate and supplied with a ground voltage VSS through its source. A second resistor is connected between the global data line GIO and a drain of the NMOS transistor.

The storage unit 400 includes a plurality of inverters. The storage unit 400 stores a data transmitted to the global data line GIO in response to the global control signal EN_GIO_TERM.

Figure 4:
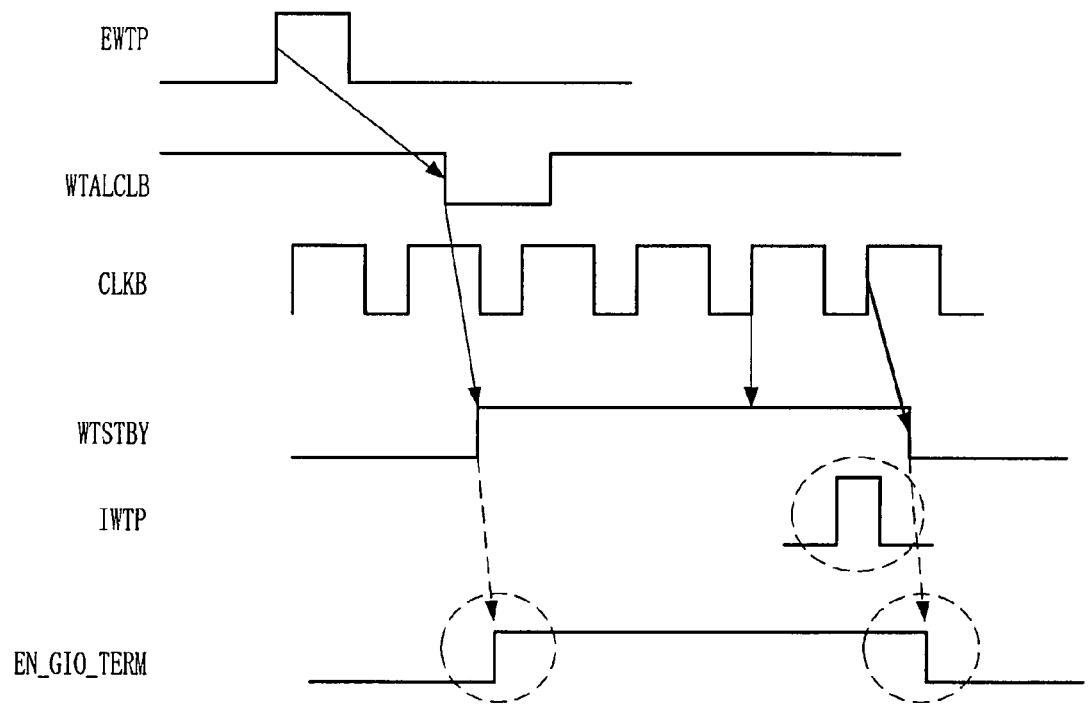
FIG. 4 is a signal timing diagram illustrating an operation of a controller in FIG. 3.

FIG. 4 is a signal timing diagram illustrating an operation of a controller in FIG. 3. An external write signal EWTP is inputted first. The first delay unit 122 outputs a write latency signal WTALCLB by delaying the external write signal EWTP for a predetermined time corresponding to write latency, i.e., less write latency by two internal clocks.

The second delay unit 124 receives an internal clock signal CLKB and operates in synchronization with the internal clock signal CLKB. The second delay unit 124 transmits the write latency signal WTALCLB and outputs first to six delay signals at every half internal clock.

The alarm signal generator 140 generate a write alarm signal WTSTBY when at least one of the write latency signal WTALCLB and the first to six signals is activated. The control signal generator 200 activates a global control signal EN_GIO_TERM in response to the write alarm signal WTSTBY.

Thereafter, an internal write signal IWTP is activated over two internal clocks after the write alarm signal WTSTBY is activated. An external data is inputted into a memory cell. After a write operation, the write alarm signal WTSTBY is inactivated and the control signal generator 200 inactivates the global control signal EN_GIO_TERM according to the write alarm signal WTSTBY.

The external write signal EWTP is delayed for a delay time which is two internal clocks less than the write latency WL and output as the write latency signal WTALCLB. That is, the write latency signal WTALCLB is activated three internal clocks earlier than input time of the internal write signal IWTP.

Figure 5:
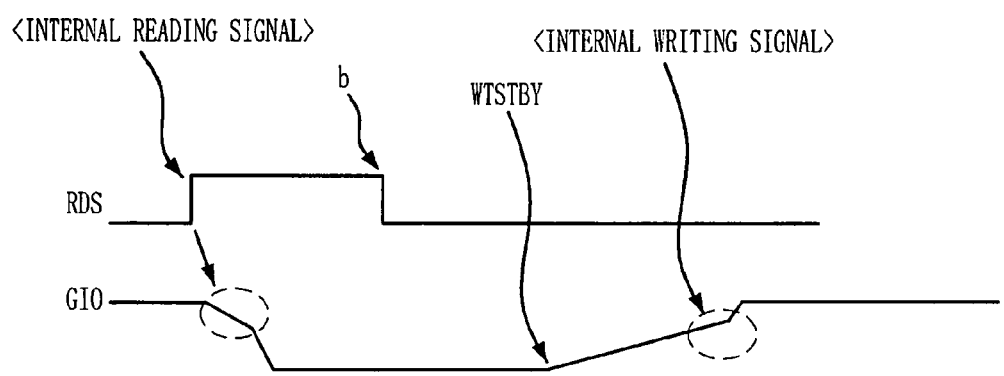
FIG. 5 is a signal timing diagram illustrating an operation of the semiconductor memory device in FIG. 3.

FIG. 5 is a signal timing diagram illustrating an operation of the semiconductor memory device in FIG. 3.

For a read operation, a read period signal RDS is activated in response to an internal read signal. A control signal generator 200 activates a global control signal EN_GIO_TERM in response to the read period signal RDS. A termination resistor unit 300 supplies termination resistance including pull-up and pull down resistance to a global data line GIO in response to the global control signal EN_GIO_TERM. Accordingly, a voltage on the global data line GIO maintains a half of a supply voltage level ½ VDD.

Thereafter, a data output from a memory cell is transmitted to the global data line GIO. A data having a low logic level is transmitted in above embodiment. The read period signal RDS is inactivated over a delay time corresponding to a burst length BL, i.e., a half of the burst length BL/2, from activation timing of the internal read signal. The termination resistor unit 300 turns off and a storage unit 400 stores data on the global data line GIO.

When new external write signal EWTP is inputted, the control unit activates the global control signal EN_GIO_TERM. The termination resistor unit turns on again. The active termination resistor unit makes a voltage level of the global data line GIO to be the half of the supply voltage ½ VDD.

An internal write signal IWTP is activated over a delay time corresponding to a write latency WL from an input timing of the external write signal EWTP. An external data is inputted to the global data line GIO in response to the internal write signal IWTP. If the external data has a high logic level, a data transition occurs in a range of the half of the supply voltage ½ VDD. Because the termination resistor unit 300 makes the voltage on the global line GIO the half of the supply voltage ½ VDD before a subsequent operation, a range of data transition decreases.

As described above, before the write operation begins in response to the internal write signal IWTP, the global control signal EN_GIO_TERM is activated and the termination resistor unit 330 is activated. Accordingly, the termination resistance is supplied before a real write operation. An external data is inputted to the global data line GIO faster than conventional input timing. At the end of the write operation, the termination resistor unit 300 turns off. Consumption of active standby current ICC3 decreases.

While a termination resistor unit and a storage unit is controlled by a read period signal in above embodiment, flag signals informing the write operation can be used for control. The read period signal is one of signals activated by a read command for informing the write operation.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising:
    a global data line for transmitting data;
    a control unit for generating a global control signal which is activated in response to an external write signal and an internal read signal, wherein the global control signal is inactivated at a first predefined time after an activation of the internal read signal and is activated at a second predefined time before an activation of an internal write signal;
    a termination resistance unit for supplying termination resistance to the global data line so that the global data line maintains a predetermined voltage level before the activation of the internal write signal in response to the global control signal; and
    a storage unit for storing the data transmitted to the global data line while the termination resistance unit is inactivated.

2. The semiconductor memory device of claim 1, wherein the control unit includes:
    a write alarm unit for generating a write alarm signal in response to the external write signal; and
    a control signal generator for generating the global control signal in response to the internal read signal and the write alarm signal.

3. The semiconductor memory device of claim 2, wherein the write alarm unit includes:
    a shifting unit for outputting a plurality of delay signals by delaying the external write signal for a predetermined time corresponding to a write latency; and
    an alarm signal generator for receiving the plurality of delay signals and outputting the write alarm signal.

4. The semiconductor memory device of claim 2, wherein the control signal generator includes:
    a first logic gate for performing a NOR operation on the write alarm signal and the internal read signal; and
    a first inverter for inverting an output of the first logic gate to output the global control signal.

5. The semiconductor memory device of claim 3, wherein the shifting unit includes:
    a first delay unit for outputting the internal write signal by delaying the external write signal for the predetermined time corresponding to the write latency; and
    a second delay unit for outputting the plurality of delay signals by delaying the internal write signal for each half internal clock.

6. A method for driving a semiconductor memory device, comprising:
    detecting a read operation and a write operation;
    supplying a termination resistance to a global data line when the read operation is activated;
    transmitting a read data to the global data line;
    disconnecting the terminal resistance from the global data line after a first predefined time;
    storing the read data loaded on the global data line;
    supplying the terminal resistance to the global data line at a second predefined time before an activation of-the write operation;
    transmitting a write data to the global data line when the write operation is activated; and
    disconnecting the terminal resistance from the global data line after a second predetermined time.

7. The method of claim 6, wherein the activation of the read or write operation includes detecting a read or a write signal.

8. The method of claim 6, where the supplying of the termination resistance is performed for a predetermined time corresponding to a write latency after an external write signal is activated.

* * * * *